US007800970B2

(12) United States Patent
Hong et al.

(10) Patent No.: US 7,800,970 B2

(45) Date of Patent: Sep. 21, 2010

(54) SENSE AMPLIFIER AND SEMICONDUCTOR MEMORY DEVICE HAVING THE SAME

(75) Inventors: Sang-Pyo Hong, Yongin-si (KR); Jun-Hee Lim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 95 days.

(21) Appl. No.: 12/167,396

(22) Filed: Jul. 3, 2008

(65) Prior Publication Data

US 2009/0010086 A1 Jan. 8, 2009

(30) Foreign Application Priority Data

Jul. 6, 2007 (KR) ...................... 10-2007-0068226

(51) Int. Cl.

| | |
|---|---|
| ***G11C 7/02*** | (2006.01) |
| ***G11C 16/06*** | (2006.01) |
| ***G11C 7/10*** | (2006.01) |
| ***H03F 3/45*** | (2006.01) |

(52) U.S. Cl. .................. 365/208; 365/207; 365/185.21; 327/51; 327/52; 327/57

(58) Field of Classification Search .................. 365/208
See application file for complete search history.

(56) References Cited

U.S. PATENT DOCUMENTS

| | | | | |
|---|---|---|---|---|
| 6,281,713 | B1 * | 8/2001 | Kim | 327/55 |
| 6,323,693 | B1 * | 11/2001 | Park | 327/56 |
| 6,326,815 | B1 * | 12/2001 | Sim et al. | 327/57 |
| 6,396,310 | B2 * | 5/2002 | Shin | 327/55 |
| 6,424,577 | B2 * | 7/2002 | Sim | 365/189.05 |
| 6,483,351 | B2 * | 11/2002 | Sim | 327/52 |
| 6,483,353 | B2 * | 11/2002 | Kim et al. | 327/55 |
| 6,617,885 | B2 * | 9/2003 | Lim et al. | 327/57 |
| 6,721,218 | B2 * | 4/2004 | Lim | 365/205 |
| 6,788,112 | B1 | 9/2004 | Chan et al. | |
| 7,038,963 | B2 * | 5/2006 | Lee | 365/207 |
| 7,573,756 | B2 * | 8/2009 | Seo | 365/189.15 |
| 7,616,513 | B1 * | 11/2009 | Peng et al. | 365/207 |
| 2008/0048728 | A1 * | 2/2008 | Hong et al. | 327/51 |

FOREIGN PATENT DOCUMENTS

| | | | |
|---|---|---|---|
| KR | 1020010093475 | A | 10/2001 |
| KR | 1020030002504 | A | 1/2003 |

* cited by examiner

*Primary Examiner*—Son L Mai

(74) *Attorney, Agent, or Firm*—F. Chau & Associates, LLC

(57) ABSTRACT

A sense amplifier circuit includes a current sense amplifier, a voltage sense amplifier, and an output stabilizing circuit. The current sense amplifier amplifies differential input currents to generate differential output voltages and provides the differential output voltages to a sense amplifier output line pair. The voltage sense amplifier is coupled to the sense amplifier output line pair to amplify the differential output voltages on the sense amplifier output line pair. The voltage sense amplifier is activated at the time later than a time of activation of the current sense amplifier. The output stabilizing circuit is coupled to the sense amplifier output line pair to stabilize the differential output voltages on the sense amplifier output line pair. The output stabilizing circuit has a positive input resistance. Accordingly, the sense amplifier circuit reduces power consumption and an occupied area on a semiconductor chip.

19 Claims, 12 Drawing Sheets

1400a 1410 1402 1440 1450 NSA01 VSA01 1460 1470 1480

IIN1 GIO CURRENT SENSE AMPLIFIER IVC PRECHARGER & EQUALIZER EQUALIZER VOLTAGE SENSE AMPLIFIER LATCH CIRCUIT DRIVER SAO

IIN2 GIOB 1404 RS 1420 NSA02 RD VSA02 1430 DP1 P2

RT OUTPUT STABILIZING CIRCUIT DELAY CIRCUIT

CSLM P1

1400a
CURRENT SENSE AMPLIFIER
1410
IIN1
GIO
IIN2
GIOB
1402
1404
IVC
RT
PRECHARGER & EQUALIZER
1440
RS
CSLM
OUTPUT STABILIZING CIRCUIT
1420
EQUALIZER
1450
NSAO1
NSAO2
P1
VSAO1
VSAO2
RD
DELAY CIRCUIT
1430
DP1
VOLTAGE SENSE AMPLIFIER
1460
LATCH CIRCUIT
1470
P2
DRIVER
1480
SAO

V[V]
1
0.5
43n
44n
45n
TIME
P1
P2
DP1B
VSA01_2
VSA01_1
VSA02_1
VSA02_2

1400b
CURRENT SENSE AMPLIFIER
PRECHARGER & EQUALIZER
OUTPUT STABILIZING CIRCUIT
EQUALIZER
DELAY CIRCUIT
VOLTAGE SENSE AMPLIFIER
LATCH CIRCUIT
DRIVER
PRECHARGE VOLTAGE GENERATING CIRCUIT
1410
1402
1404
1440
1420
1450
1430
1460
1470
1480
1490
IIN1
IIN2
GIO
GIOB
VPRC
RT
RS
RD
P1
P2
DP1
NSA01
NSA02
SAO
RD_EN
CSLM

1400c
SAO
1480
DRIVER
1470
LATCH CIRCUIT
P2
1460
VOLTAGE SENSE AMPLIFIER
DP1
1430
DELAY CIRCUIT
RD
NSA01
1450
EQUALIZER
NSA02
P1
1420a
OUTPUT STABILIZING CIRCUIT
CSA_EN
CSA CONTROL CIRCUIT
1485
1440
PRECHARGER & EQUALIZER
RS
1404
1402
RT
VPRC
1410
CURRENT SENSE AMPLIFIER
1490
PRECHARGE VOLTAGE GENERATING CIRCUIT
IIN1
GIO
IIN2
GIOB
RD_EN
CSLM

CSLM
CSA_EN
VSA01
VSA02
DP1B
P1
V[V]
IVC
V[V]
IVC/2
TIME

SENSE AMPLIFIER AND SEMICONDUCTOR MEMORY DEVICE HAVING THE SAME

CROSS-REFERENCE TO RELATED APPLICATION

This application claims priority under 35 USC §119 to Korean Patent Application No. 2007-0068226, filed on Jul. 6, 2007, in the Korean Intellectual Property Office (KIPO), the contents of which are incorporated herein in its entirety by reference.

BACKGROUND OF THE INVENTION

1. Technical Field

The present disclosure relates to a semiconductor memory device and, more particularly, to a sense amplifier circuit, a semiconductor memory device having a sense amplifier and a method of amplifying a signal.

2. Discussion of Related Art

A semiconductor memory device is used for storing data in various electronic products and applications. A sense amplifier circuit is used during a data input-output (I/O) procedure in the semiconductor memory device. The sense amplifier circuit includes a bit-line sense amplifier circuit amplifying voltages of a bit-line pair, a local sense amplifier circuit amplifying voltages of a local I/O line pail; and an I/O sense amplifier circuit amplifying voltages of a global I/O line pair.

As the load of an I/O sense amplifier circuit implemented with conventional voltage sense amplifiers is increased, the 110 sense amplifier circuit has difficulties in sensing voltage differences, because a distance between the I/O sense amplifier circuit and a memory cell array becomes longer. Usually, an I/O sense amplifier circuit implemented with current sense amplifiers may be used in order to obviate the above-mentioned problems. As an amplification gain is increased, an input resistance of the I/O sense amplifier circuit implemented with the current sense amplifiers may have a negative value, and thus the I/O sense amplifier circuit may be unstable. Another conventional I/O sense amplifier circuit for obviating this problem may include a current sense amplifier implemented with large-sized transistors and a differential amplifier coupled to output terminals of the current sense amplifier. When, sizes of transistors in the current sense amplifier are increased, however, the sizes of the I/O sense amplifier circuit are significantly increased and a current consumption is also increased.

SUMMARY OF THE INVENTION

Accordingly, exemplary embodiments of the present invention are provided to substantially obviate one or more problems due to limitations and disadvantages of the related art.

Exemplary embodiments of the present invention provide a sense amplifier circuit having a high amplification gain and that can stably perform an amplification operation in a low voltage.

Exemplary embodiments of the present invention provide a semiconductor memory device including the sense amplifier circuit.

Exemplary embodiments of the present invention provide a method of controlling a sense amplifier circuit having a high amplification gain and that can stably perform an amplification operation in a low voltage.

According to exemplary embodiments of the present invention, a sense amplifier circuit includes a current sense amplifier, a voltage sense amplifier, and an output stabilizing circuit. The current sense amplifier amplifies differential input currents to generate differential output voltages and provides the differential output voltages to a sense amplifier output line pair. The voltage sense amplifier is coupled to the sense amplifier output line pair to amplify the differential output voltages on the sense amplifier output line pair. The voltage sense amplifier is activated at a time later than a time of activation of the current sense amplifier. The output stabilizing circuit is coupled to the sense amplifier output line pair to stabilize the differential output voltages on the sense amplifier output line pair. The output stabilizing circuit has a positive input resistance.

In exemplary embodiments, the output stabilizing circuit may operate as a load of the current sense amplifier.

In exemplary embodiments, a combined parallel resistance of the input resistances of the voltage sense amplifier and the output stabilizing circuit may have a positive value.

In exemplary embodiments, an absolute value of the input resistance of the output stabilizing circuit may be smaller than an absolute value of the input resistance of the voltage sense amplifier.

In exemplary embodiments, the current sense amplifier may be deactivated after the voltage sense amplifier is activated.

According to exemplary embodiments, the sense amplifier circuit may further include a precharger/equalizer circuit and an equalizer. The precharger/equalizer circuit precharges the sense amplifier output line pair to a first precharge voltage and equalizes the sense amplifier output line pair, in response to a first control signal. The equalizer equalizes the sense amplifier output line pair in response to a second control signal that is activated at a time later than a time of activation of the first control signal.

In exemplary embodiments, the sense amplifier circuit may further include a delay circuit configured to delay the second control signal to generate a third control signal, and the voltage sense amplifier may be activated in response to the third control signal.

In exemplary embodiments, the sense amplifier circuit may further include a precharge voltage generating circuit. The precharge voltage generating circuit selects an internal power supply voltage and a first reference voltage in response to a read enable signal to generate the selected voltage as the first precharge voltage.

In exemplary embodiments, the first reference voltage may have a voltage level of about one half of the internal power supply voltage.

In exemplary embodiments, the precharge voltage generating circuit may include a p-type metal oxide semiconductor (PMOS) transistor and an n-type metal oxide semiconductor (NMOS) transistor. The PMOS transistor outputs the internal power supply voltage as the first precharge voltage in response to the read enable signal. The NMOS transistor outputs the first reference voltage as the first precharge voltage in response to the read enable signal.

In exemplary embodiments, the output stabilizing circuit may be activated in response a current sense amplifier enable signal.

According to exemplary embodiments of the present invention, a semiconductor memory device includes a memory core coupled to a bit-line pair, a column selection circuit, a local sense amplifier circuit, and an I/O sense amplifier circuit. The column selection circuit outputs voltage signals of the bit-line pair to a local input-output (I/O) line pair in response to a column selection signal. The local sense amplifier circuit amplifies signals of the local I/O line pair to output the amplified signals to a global I/O line pair. The I/O sense amplifier circuit amplifies signals of the global I/O line pair to generate output data.

The I/O sense amplifier circuit includes a current sense amplifier, a voltage sense amplifier, and an output stabilizing circuit.

The current sense amplifier amplifies differential input currents to generate differential output voltages and provides the differential output voltages to a sense amplifier output line pair. The voltage sense amplifier is coupled to the sense amplifier output line pair to amplify the differential output voltages on the sense amplifier output line pair. The voltage sense amplifier is activated at a time later than a time of activation of the current sense amplifier. The output stabilizing circuit is coupled to the sense amplifier output line pair to stabilize the differential output voltages on the sense amplifier output line pair. The output stabilizing circuit has a positive input resistance.

In a method of amplifying signals according to exemplary embodiments of the present invention, a current sense amplifier is activated and differential output voltages are generated by amplifying differential input currents in the current sense amplifier. The differential output voltages are provided to a sense amplifier output line pair. A voltage sense amplifier is activated after the current sense amplifier and the differential output voltages on the sense amplifier output line pair are amplified in the voltage sense amplifier. An input resistance of the voltage sense amplifier having a negative value is compensated by an output stabilizing circuit having a positive resistance. The current sense amplifier is disabled after the voltage sense amplifier is activated.

In exemplary embodiments, the current sense amplifier may be deactivated after the voltage sense amplifier is activated.

The sense amplifier circuit corresponding to a dual sense amplifier implemented with both the current sense amplifier and the voltage sense amplifier has a high amplification gain and stably performs an amplification operation. The sense amplifier circuit according to an exemplary embodiment of the present invention may reduce a sensing time compared with the conventional sense amplifier. Because the dissipation current in the current sense amplifier is significantly decreased after the difference between the differential output voltages is developed and the current sense amplifier may be deactivated after the voltage sense amplifier is enabled, current dissipation may be reduced. The sense amplifier circuit according to an exemplary embodiment of the present invention may guarantee a timing margin for performing the next sensing operation. Moreover, the sense amplifier circuit according to an exemplary embodiment of the present invention does not require an additional differential amplifier. Accordingly, the sense amplifier circuit according to an exemplary embodiment of the present invention may reduce the power consumption and the occupation area in the semiconductor device. Because the current sense amplifier and the voltage sense amplifier included in the sense amplifier circuit according to an exemplary embodiment of the present invention may be activated at different points, the current sense amplifier may stably amplify and generate differential output voltages although active elements may be mismatched with respect to each other.

BRIEF DESCRIPTION OF THE DRAWINGS

Exemplary embodiments of the present invention will be understood in more detail from the following descriptions taken in conjunction with the attached drawings.

DETAILED DESCRIPTION OF EXEMPLARY EMBODIMENTS

Figure 1:
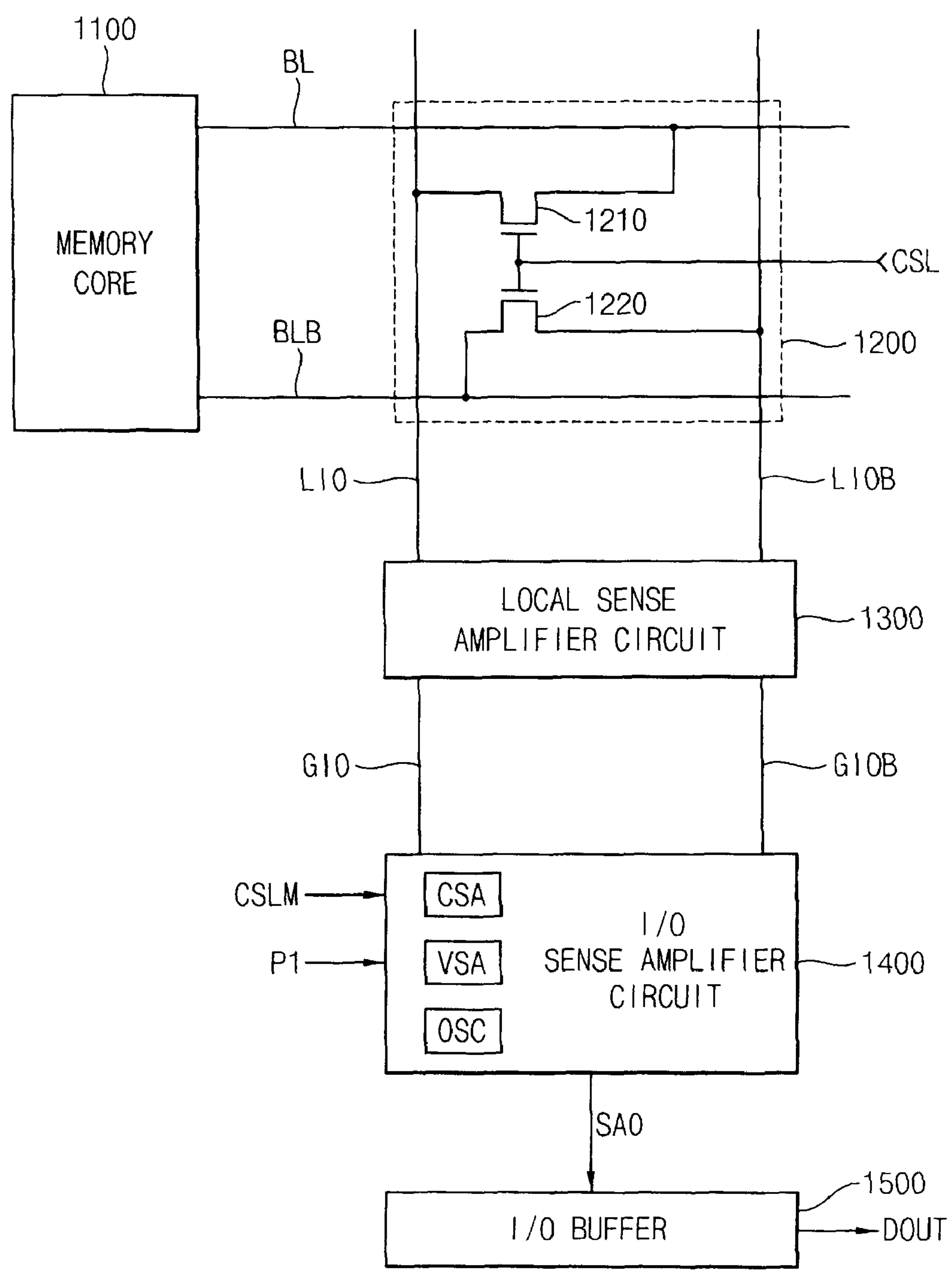
FIG. 1 is a circuit diagram illustrating a semiconductor device according to an exemplary embodiment of the present invention.

Exemplary embodiments of the present invention now will be described more fully with reference to the accompanying drawings, in which exemplary embodiments of the invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. Like reference numerals refer to like elements throughout this application.

FIG. 1 is a circuit diagram illustrating a semiconductor device 1000 according to an exemplary embodiment of the present invention. Data output paths of the semiconductor memory device 1000 are illustrated in FIG. 1.

Referring to FIG. 1, the semiconductor memory device 1000 may include a memory core 1100, a column selection circuit 1200, a local sense amplifier circuit 1300, an input/output (I/O) sense amplifier circuit 1400, and an 110 buffer 1500. For convenience of description, only one pair of bit lines BL and BLB coupled to the memory core 1100 is illustrated in FIG. 1. A bit-line pair includes a bit-line BL and a complementary bit-line BLB. A local I/O line pair includes a local I/O line LIO and a complementary local I/O line LIOB. A global I/O line pair includes a global I/O line GIO and a complementary global 110 line GIOB.

Figure 2:
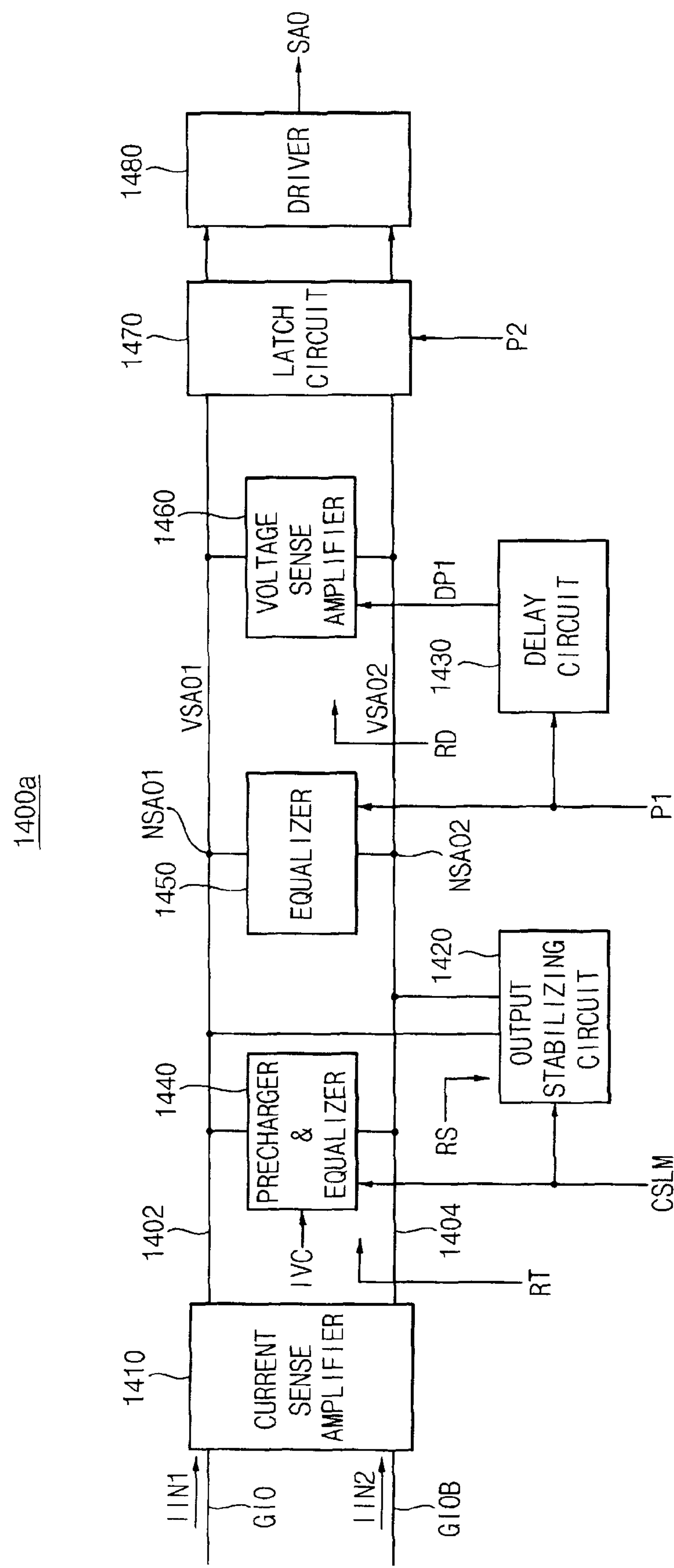
FIG. 2 is a circuit diagram illustrating an input-output (I/O) sense amplifier circuit according to an exemplary embodiment of the present invention.

Although not shown, the memory core 1100 may include a memory cell array, a bit-line sense amplifier circuit, and a precharger/equalizer circuit. The column selection circuit 1200 outputs voltage signals of the bit-line pair BL and BLB to the local I/O line pair LIO and LIOB in response to a column selection signal CSL fed thereto. The column selection circuit 1200 may include a first n-type metal oxide semiconductor (NMOS) transistor 1210 and a second NMOS transistor 1220. The first NMOS transistor 1210 electrically couples the bit-line BL with the local I/O line LIO in response to the column selection signal CSL. The second NMOS transistor 1220 electrically couples the complementary bit-line BLB with the complementary local I/O line LIOB in response to the column selection signal CSL. The local sense amplifier circuit 1300 amplifies signals of the local I/O line pair LIO and LIOB, and outputs the amplified signals to the global I/O line pair GIO and GIOB. The I/O sense amplifier circuit 1400 amplifies signals of the global I/O line pair GIO and GIOB in response to control signals CSLM, P1, and an internal control signal DP1 shown in FIG. 2. The I/O sense amplifier circuit 1400 includes a current sense amplifier CSA, a voltage sense amplifier VSA, and an output stabilizing circuit OSC. The first control signal CSLM corresponds to a column selection master signal. The current sense amplifier CSA is activated in response to a second control signal P1. The voltage sense amplifier VSA is activated based on a third control signal DP1, which is shown in FIG. 2, that is activated after the second control signal P1. For example, the third control signal DP1 may be generated by delaying the second control signal P1. The I/O buffer 1500 buffers an output signal SAO of the I/O sense amplifier circuit 1400 to generate output data DOUT.

FIG. 2 is a circuit diagram illustrating an I/O sense amplifier circuit according to an exemplary embodiment of the present invention, which may be included in the semiconductor memory device 1000 of FIG. 1.

Referring to FIG. 2, an I/O sense amplifier circuit 1400*a* may include a current sense amplifier 1410, a voltage sense amplifier 1460, and an output stabilizing circuit 1420.

The current sense amplifier 1410 amplifies differential input currents IIN1 and IIN2, generates differential output voltages VSAO1 and VSAO2, and provides the differential output voltages VSAO1 and VSAO2 to a sense amplifier output line pair formed of a first line 1402 and a second line 1404. The voltage sense amplifier 1460 is coupled between the sense amplifier output line pair 1402 and 1404, and is activated later than a time when the current sense amplifier 1410 is activated. The voltage sense amplifier 1460 amplifies the differential output voltages VSAO1 and VSAO2 in response to the third control signal DP1. The output stabilizing circuit 1420 is coupled to the sense amplifier output line pair 1402 and 1404, has a positive input resistance, and stabilizes the differential output voltages VSAO1 and VSAO2 on the sense amplifier output line pair 1402 and 1404. The output stabilizing circuit 1420 operates as a load of the current sense amplifier 1410.

The I/O sense amplifier circuit 1400*a* may further include a precharger/equalizer 1440, an equalizer 1450, and a delay circuit 1430.

The precharger/equalizer 1440 precharges the sense amplifier output line pair 1402 and 1404 with a first precharge voltage in response to the first control signal CSLM, and equalizes the sense amplifier output line pair 1402 and 1404. The equalizer 1450 equalizes the sense amplifier output line pair 1402 and 1404 in response to the second control signal P1 that is activated later than a time when the first control signal CSLM is activated. For example, the sense amplifier output line pair 1402 and 1404 may be equalized when the second control signal P1 corresponds to a logic state "high". The sense amplifier output line pair 1402 and 1404 may be unequalized when the second control signal P1 corresponds to a logic state "low". The delay circuit 1430 delays the second control signal P1 to generate the third control signal DP1.

The I/O sense amplifier circuit 1400*a* may further include a latch circuit 1470 and a driver 1480.

The latch circuit 1470 latches the signals of the sense amplifier output line pair 1402 and 1404 in response to a fourth control signal P2. The driver 1480 buffers output signals of the latch circuit 1470 to generate the sense amplifier output signal SAO.

In the I/O sense amplifier circuit 1400*a* of FIG. 2, the output stabilizing circuit 1420 stabilizes output signals of the voltage sense amplifier 1460 and operates as the load of the current sense amplifier 1410. Therefore, the current sense amplifier 1410 operates after the output stabilizing circuit 1420 is activated in response to the first control signal CSLM. The equalizer 1450 equalizes the sense amplifier output line pair 1402 and 1404 in response to the second control signal P1 that is activated later than a time when the first control signal CSLM is activated. For example, the sense amplifier output line pair 1402 and 1404 may be equalized when the second control signal P1 corresponds to the logic state "high". The sense amplifier output line pair 1402 and 1404 may be unequalized when the second control signal P1 corresponds to the logic state "low". The voltage sense amplifier 1460 is activated in response to the third control signal DP1 corresponding to a delayed signal of the second control signal P1. The delay circuit 1430 delays the second control signal P1 to generate the third control signal DP1.

Figure 3:
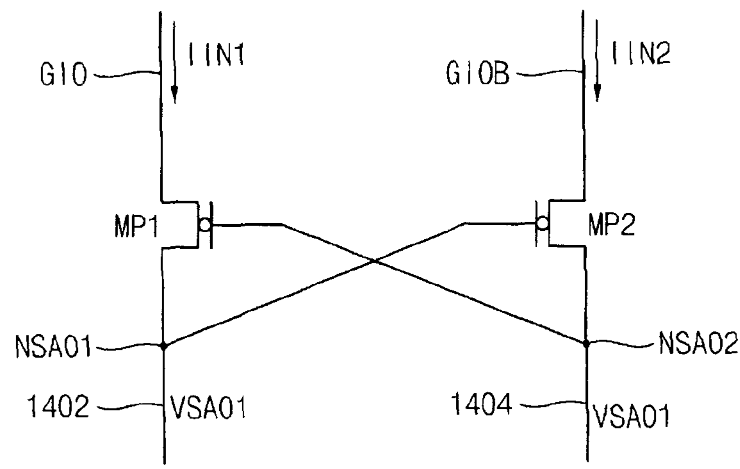
FIG. 3 is a circuit diagram illustrating an example of the current sense amplifier included in the I/O sense amplifier circuit of FIG. 2.

FIG. 3 is a circuit diagram illustrating an example of the current sense amplifier 1410 included in the I/O sense amplifier circuit 1400*a* of FIG. 2.

Referring to FIG. 3, the current sense amplifier 1410 may include a first p-type metal oxide semiconductor (PMOS) transistor MP1 and a second PMOS transistor MP2. The first PMOS transistor MP1 includes a source coupled to the global I/O line GIO, a drain coupled to a first node NSAO1, and a gate coupled to a second node NSAO2. The second PMOS transistor MP2 includes a source coupled to the complementary global I/O line GIOB, a drain coupled to the second node NSAO2, and a gate coupled to the first node NSAO1. A first input current IIN1 flows through the global I/O line GIO, and a second input current IIN2 flows through the complementary global I/O line GIOB. The first node NSAO1 is connected with the first line 1402, and a voltage of the first node NSAO1 corresponds to the first sense amplifier output voltage VSAO1. The second node NSAO2 is connected with the second line 1404, and a voltage of the second node NSAO2 corresponds to the second sense amplifier output voltage VSAO2.

Figure 4:
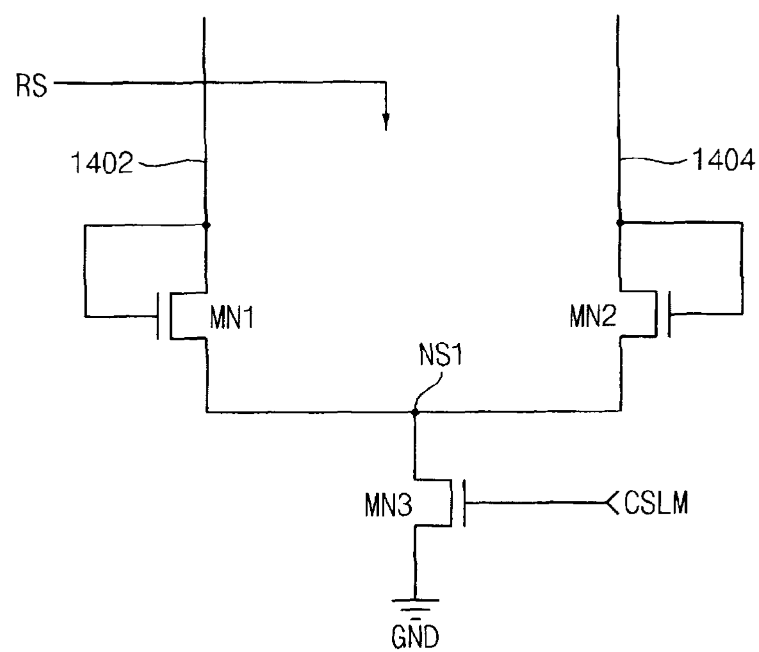
FIG. 4 is a circuit diagram illustrating an example of the output stabilizing circuit included in the I/O sense amplifier circuit of FIG. 2.

FIG. 4 is a circuit diagram illustrating an example of the output stabilizing circuit 1420 included in the I/O sense amplifier circuit 1400*a* of FIG. 2.

Referring to FIG. 4, an output stabilizing circuit 1420 may include a third NMOS transistor MN1, the first and second NMOS transistors being shown at 1210 and 1220 of FIG. 1, a fourth NMOS transistor MN2 and a fifth NMOS transistor MN3.

The third NMOS transistor MN1 includes a drain coupled to the first line 1402, a gate coupled to the first line 1402, and a source coupled to a third node NS1. The fourth NMOS transistor MN2 includes a drain coupled to the second line 1404, a gate coupled to the second line 1404, and a source coupled to the third node NS1. The fifth NMOS transistor MN3 includes a drain coupled to the third node NS1, a source coupled to a ground GND, and a gate receiving the first control signal CSLM. RS represents an equivalent resistance between the first line 1402 and the second line 1404.

Figure 5:
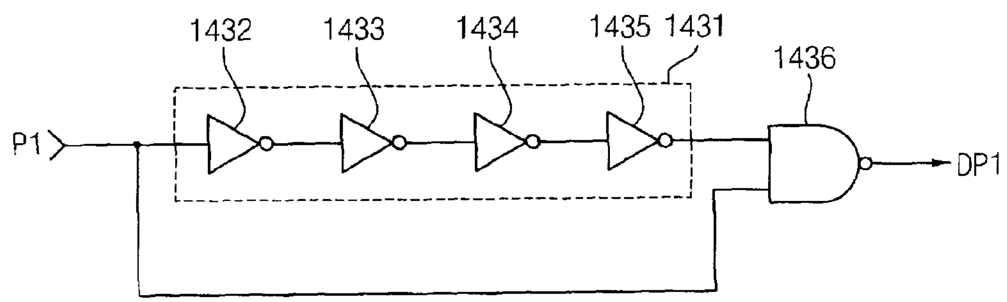
FIG. 5 is a circuit diagram illustrating an example of the delay circuit included in the I/O sense amplifier circuit of FIG. 2.

FIG. 5 is a circuit diagram illustrating an example of the delay circuit 1430 included in the I/O sense amplifier circuit 1400*a* of FIG. 2.

Referring to FIG. 5, the delay circuit 1430 includes a delay unit 1431 and a NAND gate 1436. The delay unit 1431 may include serially connected inverters 1432, 1433, 1434, and 1435 for delaying the second control signal P1. The NAND gate 1436 performs a NAND operation on the second control signal P1 and an output signal of the delay unit 1431 to generate the third control signal DP1. The delay unit 1431 may include an even number of inverters.

Figure 15:
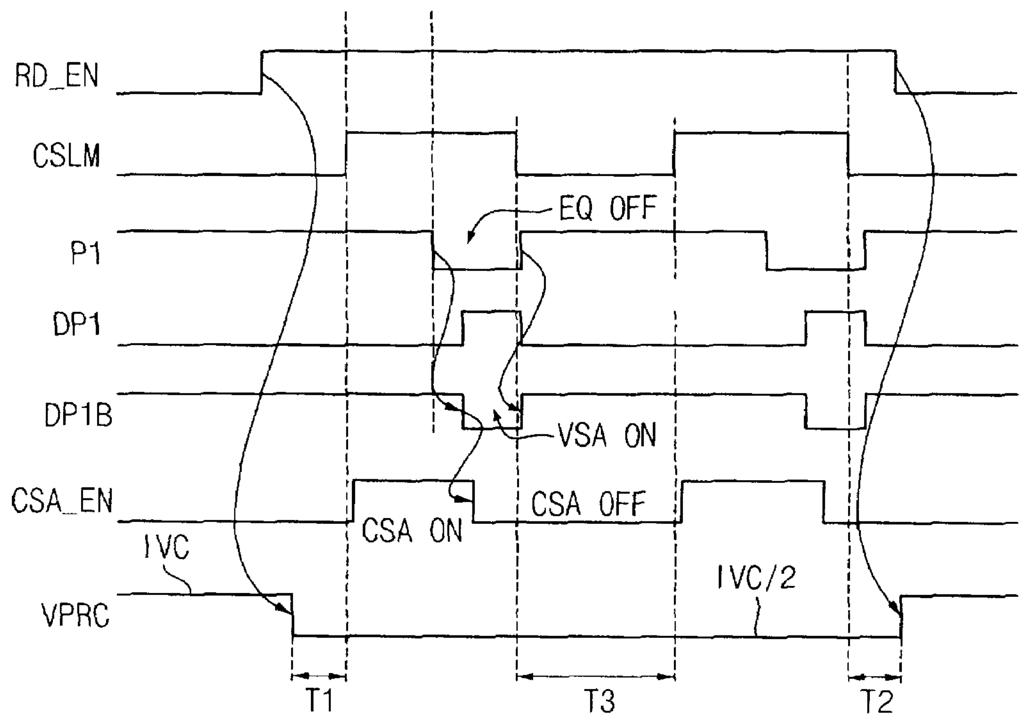
FIG. 15 is a timing diagram illustrating an operation of the I/O sense amplifier circuit of FIG. 13.

As illustrated in the timing diagram of FIG. 15, a falling edge of an inverted signal DP1B of the third control signal DP1 lags behind a falling edge of the second control signal P1. A rising edge of the inverted signal DP1B of the third control signal DP1 rarely lags behind a rising edge of the second control signal P1.

Figure 6:
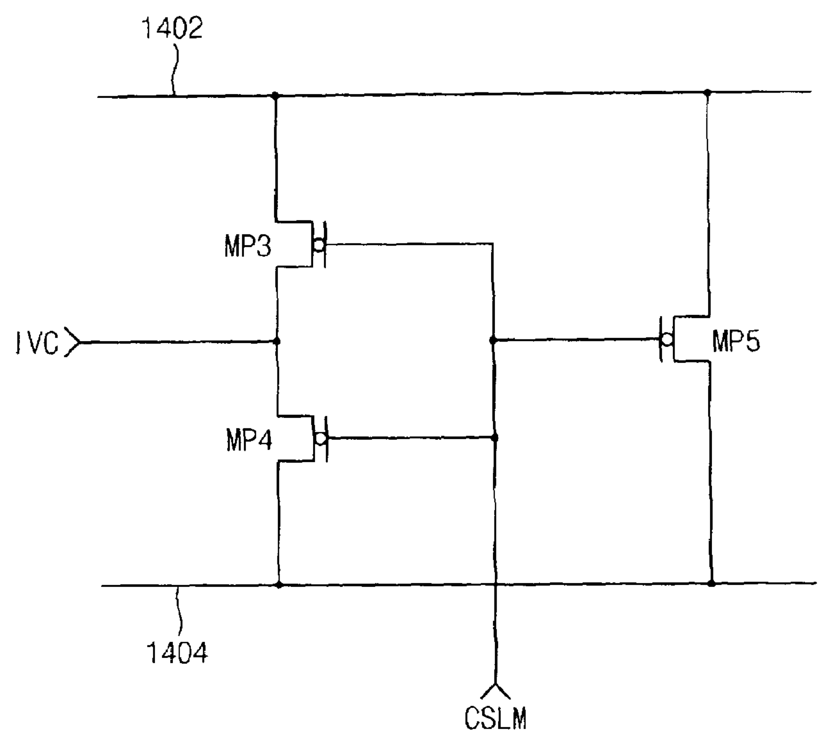
FIG. 6 is a circuit diagram illustrating an example of the precharger/equalizer included in the I/O sense amplifier circuit of FIG. 2.

FIG. 6 is a circuit diagram illustrating an example of the precharger/equalizer 1440 included in the I/O sense amplifier circuit 1400*a* of FIG. 2.

Referring to FIG. 6, a precharger/equalizer 1440 may include a third PMOS transistor MP3, a fourth PMOS transistor MP4, and a fifth PMOS transistor MP5.

The third PMOS transistor MP3 includes a source coupled to the first line 1402, a gate receiving the first control signal CSLM, and a drain receiving an internal power supply voltage IVC. The fourth PMOS transistor MP4 includes a drain coupled to the second line 1404, a gate receiving the first control signal CSLM, and a source receiving the internal power supply voltage IVC. The fifth PMOS transistor MP5 includes a source coupled to the first line 1402, a gate receiving the first control signal CSLM, and a drain coupled to the second line 1404:

The third PMOS transistor MP3 and the fourth PMOS transistor MP4 precharge the first line 1402 and the second line 1404 with the internal power supply voltage IVC in response to the first control signal CSLM. The fifth PMOS transistor MP5 equalizes voltages of the first line 1402 and the second line 1404 in response to the first control signal CSLM.

Figure 7:
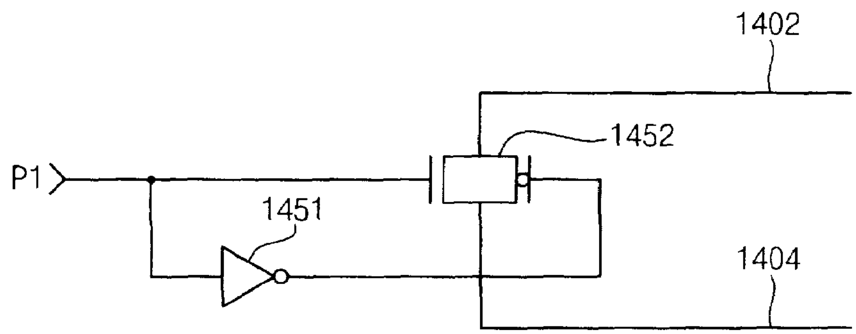
FIG. 7 is a circuit diagram illustrating an example of the equalizer included in the I/O sense amplifier circuit of FIG. 2.

FIG. 7 is a circuit diagram illustrating an example of the equalizer 1450 included in the 110 sense amplifier circuit 1400*a* of FIG. 2.

Referring to FIG. 7, the equalizer 1450 may include an inverter 1451 and a transmission gate 1452. The inverter 1451 inverts the second control signal P1. The transmission gate 1452 equalizes the voltages of the first line 1402 and the second line 1404 in response to the second control signal P1 and an output signal of the inverter 1451.

Figure 8:
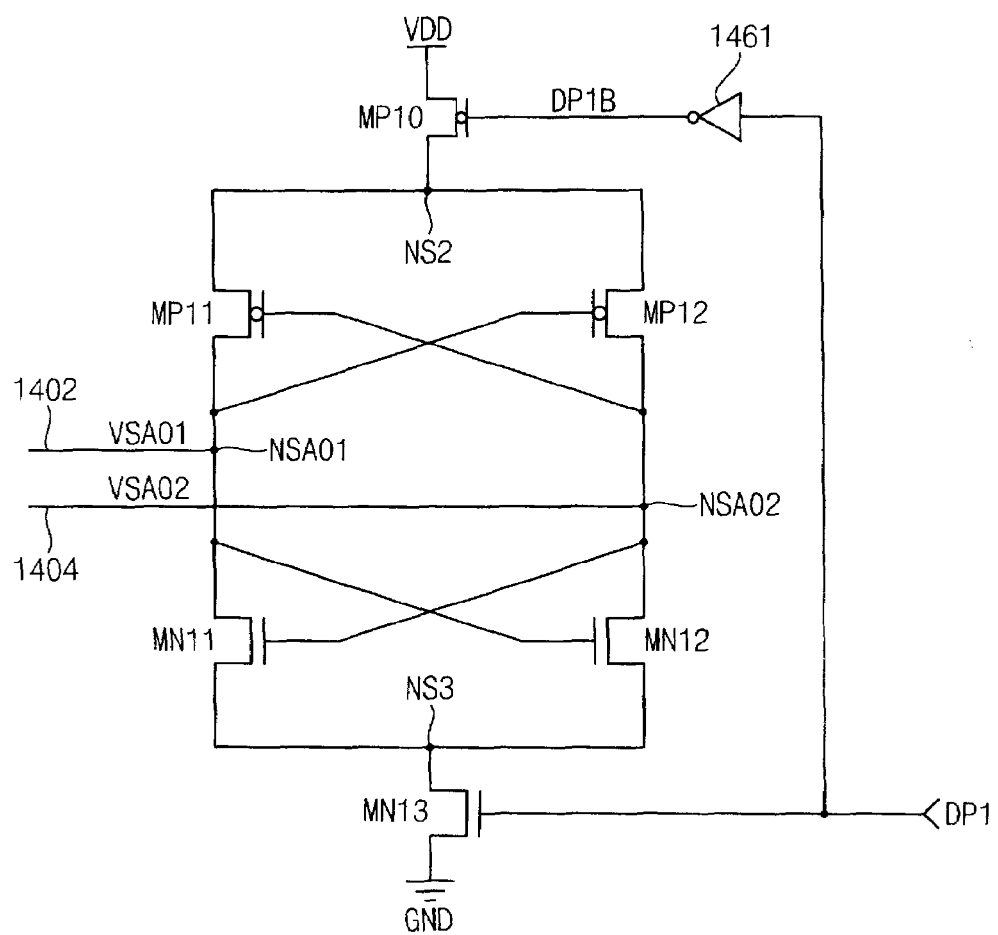
FIG. 8 is a circuit diagram illustrating an example of the voltage sense amplifier included in the 110 sense amplifier circuit of FIG. 2.

FIG. 8 is a circuit diagram illustrating an example of the voltage sense amplifier 1460 included in the I/O sense amplifier 1400*a* of FIG. 2.

Referring to FIG. 8, the voltage sense amplifier 1460 may include an inverter 1461, a sixth PMOS transistor MP10, a seventh PMOS transistor MP11, an eighth PMOS transistor MMP12, a sixth NMOS transistor MN11, a seventh NMOS transistor MN12, and an eighth NMOS transistor MN13.

The inverter 1461 inverts the third control signal DP1. The sixth PMOS transistor MP10 includes a source receiving a power supply voltage VDD, a gate receiving an output signal DP1B of the inverter 1461, and a drain coupled to a fourth node NS2. The seventh PMOS transistor MP11 includes a source coupled to the fourth node NS2, a drain coupled to the first node NSAO1, and a gate coupled to the second node NSAO2. The eighth PMOS transistor MP12 includes a source coupled to the fourth node NS2, a drain coupled to the second node NSAO2, and a gate coupled to the first node NSAO1. The sixth NMOS transistor MN11 includes a drain coupled to the first node NSAO1, a gate coupled to the second node NSAO2, and a source coupled to a fifth node NS3. The seventh NMOS transistor MN12 includes a drain coupled to the second node NSAO1, a gate coupled to the first node NSAO1, and a source coupled to the fifth node NS3. The eight NMOS transistor MN13 includes a drain coupled to the fifth node NS3, a source coupled to the ground GND, and a gate receiving the third control signal DP1. The first node NSAO1 is connected with the first line 1402. The second node NSAO2 is connected with the second line 1404.

Hereinafter, operations of the I/O sense amplifier circuit 1400*a* according to an exemplary embodiment of the present invention will be described referring to FIGS. 2 to 8.

The I/O sense amplifier circuit 1400*a* of FIG. 2 corresponds to a dual sense amplifier circuit including both the current amplifier 1410 and the voltage sense amplifier 1460. In the I/O sense amplifier circuit 1400*a*, the current amplifier 1410 and the voltage sense amplifier 1460 share input nodes and output nodes. Referring to FIG. 2, a difference between a first input current IIN1 provided through the global I/O line GIO and a second input current IIN2 provided through the complementary global I/O line GIOB is amplified by the current sense amplifier 1410 and the voltage sense amplifier 1460. The current sense amplifier 1410 operates in association with the output stabilizing circuit 1420. The output stabilizing circuit 1420 stabilizes output voltages of the voltage sense amplifier 1460 and operates as a load of the current sense amplifier 1410.

Referring to FIGS. 3 and 4, the current sense amplifier 1410 receives the input current pair IIN1 and IIN2 and generates the sense amplifier output voltage pair VSAO1 and VSAO2 corresponding to the input current pair IIN1 and IIN2. When the first input current IIN1 is greater than the second input current IIN2, the first sense amplifier output voltage VSAO1 corresponding to the voltage of the first node NSAO1 is increased and the second sense amplifier output voltage VSAO2 corresponding to the output voltage of the second node NSAO2 is decreased. The first PMOS transistor MP1 is coupled with the second PMOS transistor MP2 to form a latch structure. Accordingly, when the input current pair IIN1 and IIN2 is maintained, the first node NSAO1 maintains the first sense amplifier output voltage VSAO1 and the second node NSAO2 maintains the second sense amplifier output voltage VSAO2.

When a difference between the first sense amplifier output voltage VSAO1 and the second sense amplifier output voltage VSAO2 is increased, a gain of the current sense amplifier 1410 is also increased. When an input resistance of the current sense amplifier 1410 is decreased and a transconductance gmMN1 of the diode-connected third NMOS transistor MN1 and a transconductance gmMN2 of the fourth NMOS transistor MN2 are decreased, the gain of the current sense amplifier 1410 is increased.

The voltage sense amplifier 1460 amplifies the sense amplifier output voltage pair VSAO1 and VSAO2 generated by the current sense amplifier 1410. Referring to FIG. 8, when the third control signal DP1 is activated to the logic level "high", the sixth PMOS transistor MP10 and the eighth NMOS transistor MN13 are turned on so that the voltage sense amplifier 1460 is enabled. The voltage sense amplifier 1460 includes the cross-coupled PMOS transistor pair MP11 and MP12 and the cross-coupled NMOS transistor pair MN11 and MN12. The voltage sense amplifier 1460 amplifies a voltage difference between the sense amplifier output voltage pair VSAO1 and VSAO2 by performing a positive feedback.

Among the sense amplifier output voltage pair VSAO1 and VSAO2 generated primarily by the current sense amplifier 1410, one voltage having a comparatively high voltage level may be increased and the other voltage having a comparatively low voltage level may be decreased. As such, the voltage sense amplifier 1460 may amplify the difference between the first sense amplifier output voltage VSAO1 on the first line 1402 and the second sense amplifier output voltage VSAO2 on the second line 1404.

As mentioned above, the output stabilizing circuit 1420 operates as the load of the current sense amplifier 1410 and stabilizes the first and second sense amplifier output voltages VSAO1 and VSAO2, that is, the output voltages of the voltage sense amplifier 1460. Referring to FIGS. 4 and 8, the output stabilizing circuit 1420 may include an output stabilizing element having a positive resistance, which is coupled in parallel to the voltage sense amplifier 1460 to stabilize the output voltages of the voltage sense amplifier 1460. For example, a combined input resistance RT, shown in FIG. 2, corresponding to the sum of the input resistance RD of the voltage sense amplifier 1460 and the input resistance RS of the output stabilizing circuit 1420, may have a positive value.

Therefore, the dual sense amplifier including the current sense amplifier 1410 and the voltage sense amplifier 1460 may stably perform a differential amplifying operation.

Because the current sense amplifier 1460 and the output stabilizing circuit 1420 are coupled in parallel, the combined resistance RT of the current sense amplifier circuit 1460 and the output stabilizing circuit 1420 may be derived from Equation 1.

$$RT=RD//RS=(RD*RS)/(RD+RS) \quad \text{[Equation 1]}$$

In Equation 1, the input resistance RD of the voltage sense amplifier 1460 corresponds to a negative value and the input resistance RS of the output stabilizing circuit 1420 corresponds to a positive value. Therefore, a numerator (RD*RS) corresponds to the negative value. When an absolute value of the input resistance RS of the output stabilizing circuit 1420 is lower than an absolute value of the input resistance RD of the current sense amplifier 1460, a denominator (RD+RS) corresponds to a negative value. Accordingly, the combined resistance RT of the voltage sense amplifier 1460 and the output stabilizing circuit 1420 corresponds to a positive value.

As mentioned above, the output stabilizing circuit 1420 stabilizes the output voltages of the voltage sense amplifier 1460, operates as the load of the current sense amplifier 1410, and also generates the sense amplifier output voltage from the input current. Therefore, the current sense amplifier 1410 of FIG. 3 may include the output stabilizing circuit 1420 of FIG. 5.

The equalizer 1450 equalizes the sense amplifier output line pair 1402 and 1404 in response to the second control signal P1 activated later than a time at which the first control signal CSLM is activated. For example, the sense amplifier output line pair 1402 and 1404 may be equalized when the second control signal P1 corresponds to the logic state "high". The sense amplifier output line pair 1402 and 1404 may be unequalized when the second control signal P1 corresponds to the logic state "low". That is, the equalizer 1450 electrically couples the first line 1402 and the second line 1404 in response to the second control signal P1. When the second control signal P1 is disabled, the first line 1402 and the second line 1404 are electrically independent.

Figure 9:
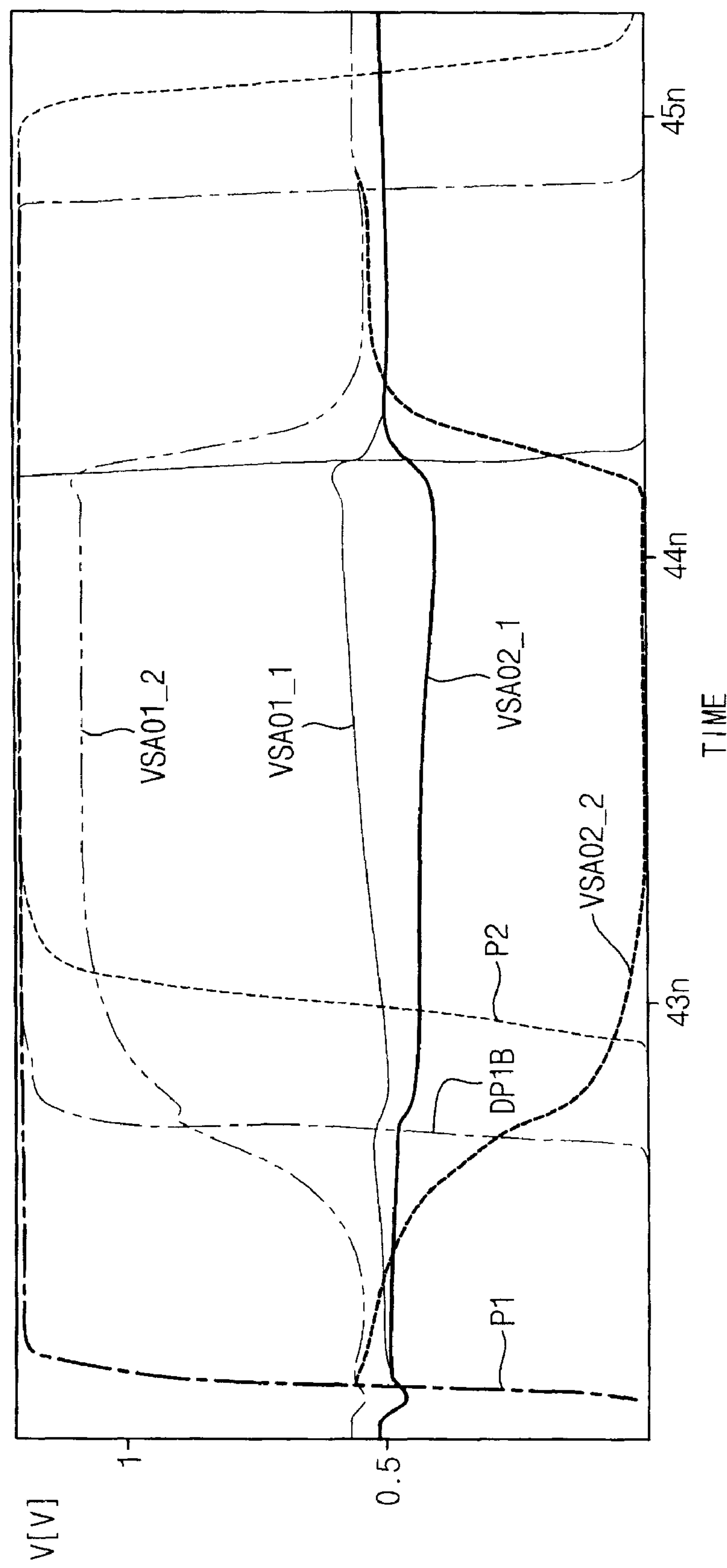
FIG. 9 is a diagram illustrating the differential output voltages of the I/O sense amplifier circuit.

FIG. 9 is a diagram illustrating the differential output voltages of the I/O sense amplifier circuit.

In FIG. 9, VSAO1_1 and VSAO2_1 correspond to the differential output voltages of the conventional I/O sense amplifier circuit exclusively implemented with the current sense amplifier. VSAO1_2 and VSAO2_2 correspond to the differential output voltages of the dual sense amplifier circuit including the current sense amplifier and the voltage sense amplifier. FIG. 9 illustrates a case where the first sense amplifier output voltage VSAO1 is higher than the second sense amplifier output voltage VSAO2. P1, DP1B, and P2 represent the second control signal P1, the inverted signal DP1B of the third control signal DP1, and the fourth control signal P2 illustrated in FIG. 2.

Referring to FIG. 9, a difference between VSAO1_2 and VSAO2_2 constituting the differential output voltages of the I/O sense amplifier circuit according to an exemplary embodiment of the present invention is greater than a difference between VSAO1_1 and VSAO2_1 constituting the differential output voltages of the conventional I/O sense amplifier circuit. That is, a gain of the I/O sense amplifier circuit according to an exemplary embodiment of the present invention is greater than a gain of the conventional I/O sense amplifier circuit.

A time for developing the difference between VSAO1_2 and VSAO2_2 fully enough to be sensed is smaller than a corresponding time for the case of VSAO1_1 and VSAO2_1 constituting the differential output voltages of the conventional I/O sense amplifier circuit. That is, the I/O sense amplifier circuit according to an exemplary embodiment of the present invention may reduce the delay time. Therefore, the I/O sense amplifier circuit according to an exemplary embodiment of the present invention may guarantee a timing margin compared with the conventional I/O sense amplifier circuit.

Figure 10:
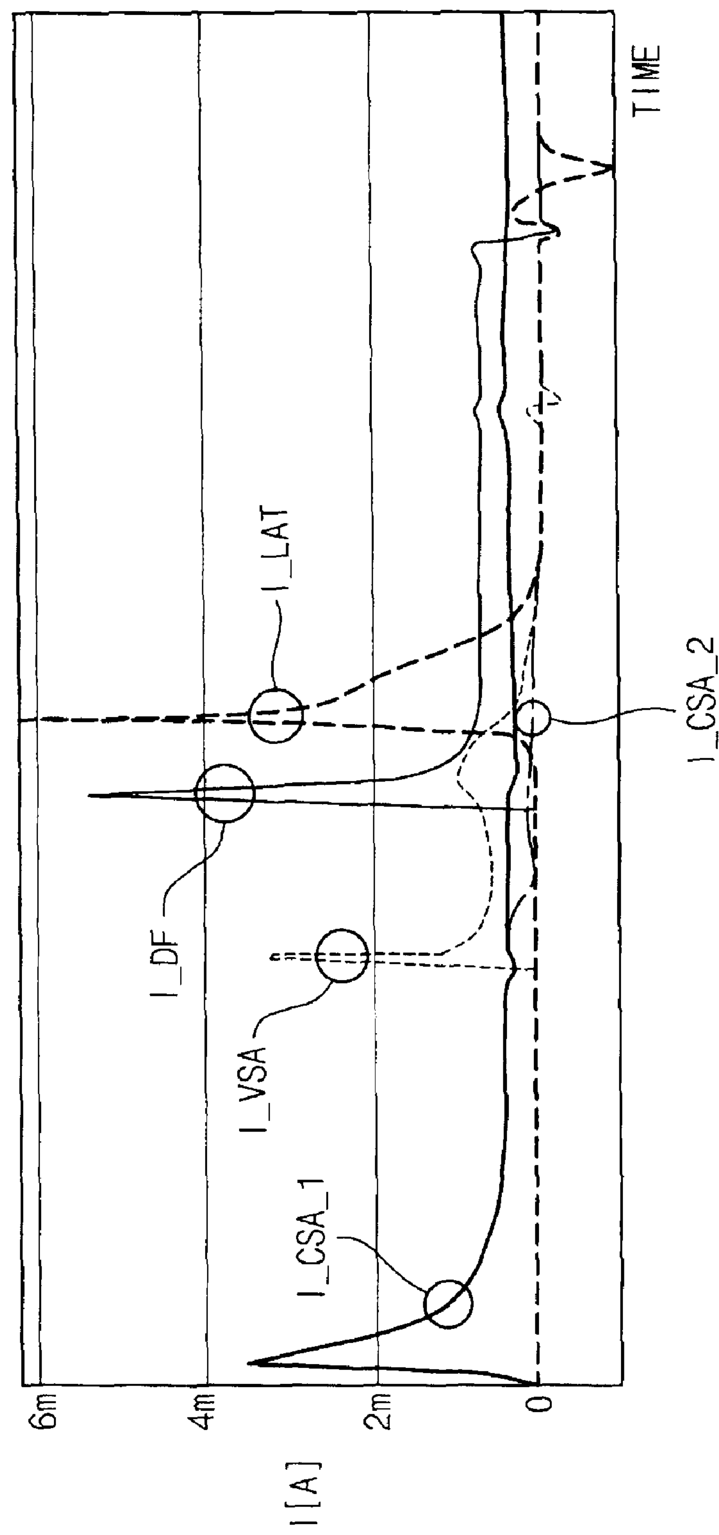
FIG. 10 is a diagram illustrating waveforms of currents dissipated in each block included in the I/O sense amplifier circuit.

FIG. 10 is a diagram illustrating waveforms of currents dissipated in each block included in the I/O sense amplifier circuit.

In FIG. 10, I_CSA_1 corresponds to a current flowing through the current sense amplifier 1410 and output stabilizing circuit 1420 shown in FIG. 2 before the voltage sense amplifier 1460 shown in FIG. 2 is activated. I_CSA_2 corresponds to a current flowing through the current sense amplifier 1410 and output stabilizing circuit 1420 shown in FIG. 2 after the voltage sense amplifier 1460 shown in FIG. 2 is activated. I_VSA corresponds to a current flowing through the current sense amplifier 1410 and output stabilizing circuit 1420 shown in FIG. 2. I_DF corresponds to a current flowing through the differential amplifier included in the conventional I/O sense amplifier circuit. I_LAT corresponds to a current flowing through the latch circuit 1470 shown in FIG. 2.

Referring to FIG. 10, the I/O sense amplifier circuit 1400*a* including the dual sense amplifier according to an exemplary embodiment of the present invention deactivates the current sense amplifier 1410 and the load of the current sense amplifier 1420 after the voltage sense amplifier 1460 is activated. Accordingly, in the I/O sense amplifier circuit 1400*a*, the current I_CSA_2 flowing through the current sense amplifier 1410 after the voltage sense amplifier 1460 is activated may be smaller than I_CSA_1. The I/O sense amplifier circuit 1400*a* shown in FIG. 2 may not have the differential amplifier included in the conventional I/O sense amplifier circuit, therefore I_DF illustrated in FIG. 10 may not be present. The I/O sense amplifier circuit 1400*a* has additional current dissipation I_VSA due to the additional voltage sense amplifier 1460. The current dissipation I_VSA due to the additional voltage sense amplifier 1460, however, is far smaller than the current dissipation I_DF in the differential amplifier included in the conventional I/O sense amplifier circuit, and thus the I/O sense amplifier circuit 1400*a* can reduce the current dissipation compared with the conventional I/O sense amplifier circuit.

Figure 11:
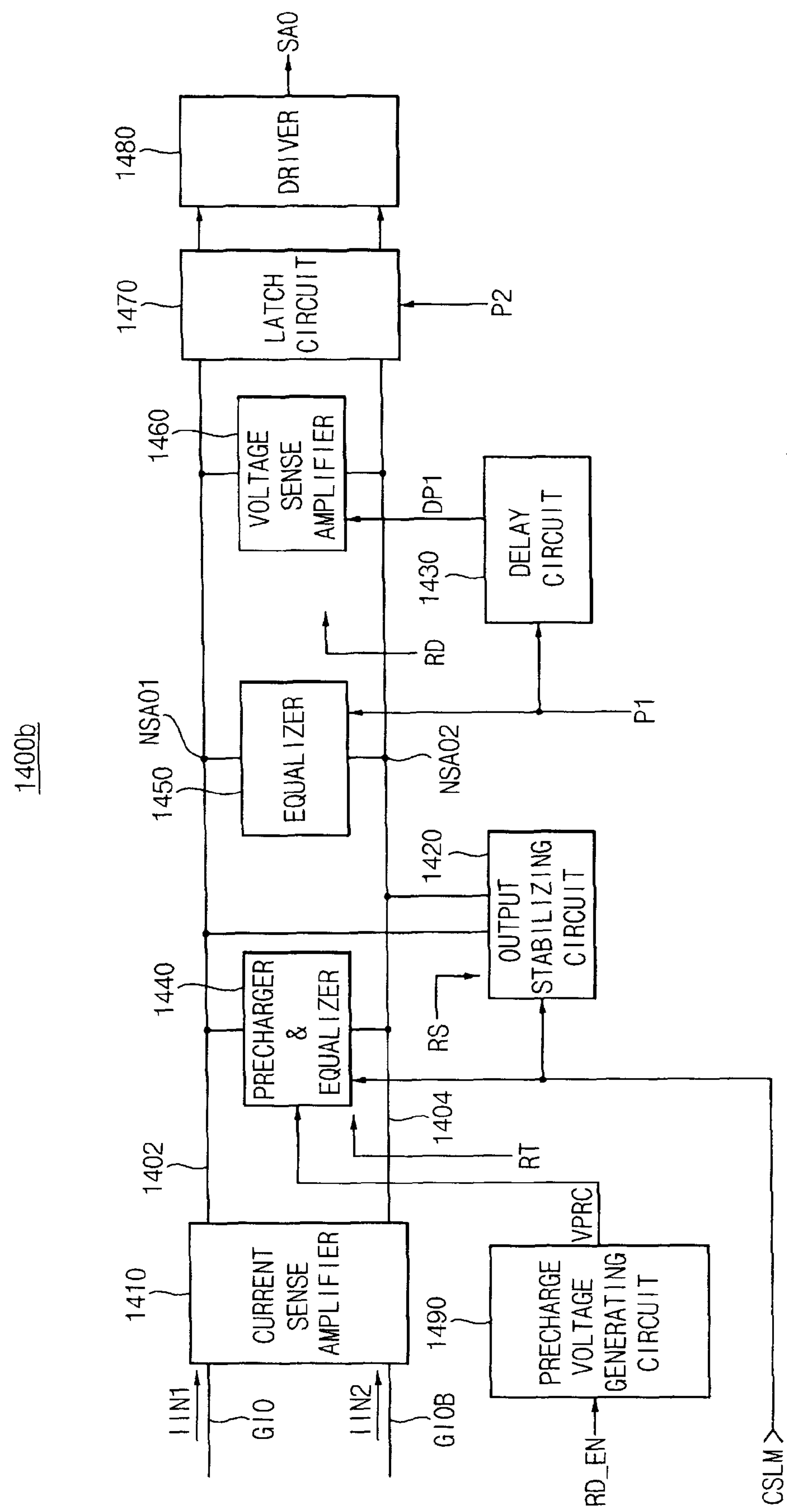
FIG. 11 is a circuit diagram illustrating an I/O sense amplifier circuit according to an exemplary embodiment of the present invention.

FIG. 11 is a circuit diagram illustrating an I/O sense amplifier circuit according to an exemplary embodiment of the present invention, which may be included in the semiconductor memory device 1000 of FIG. 1.

Referring to FIG. 11, an I/O sense amplifier circuit 1400*b* may include a current sense amplifier 1410, a voltage sense amplifier 1460, an output stabilizing circuit 1420, a precharger/equalizer 1440, an equalizer 1450, a delay circuit 1430, a latch circuit 1470, driver 1480, and a precharge voltage generating circuit 1490. The I/O sense amplifier circuit 1400*b* of FIG. 11 further includes the precharge voltage generating circuit 1490, which is not included in the I/O sense amplifier circuit 1400*a* of FIG. 2.

The precharge voltage generating circuit 1490 generates a precharge voltage VPRC in response to a read enable signal RD_EN.

Figure 12:
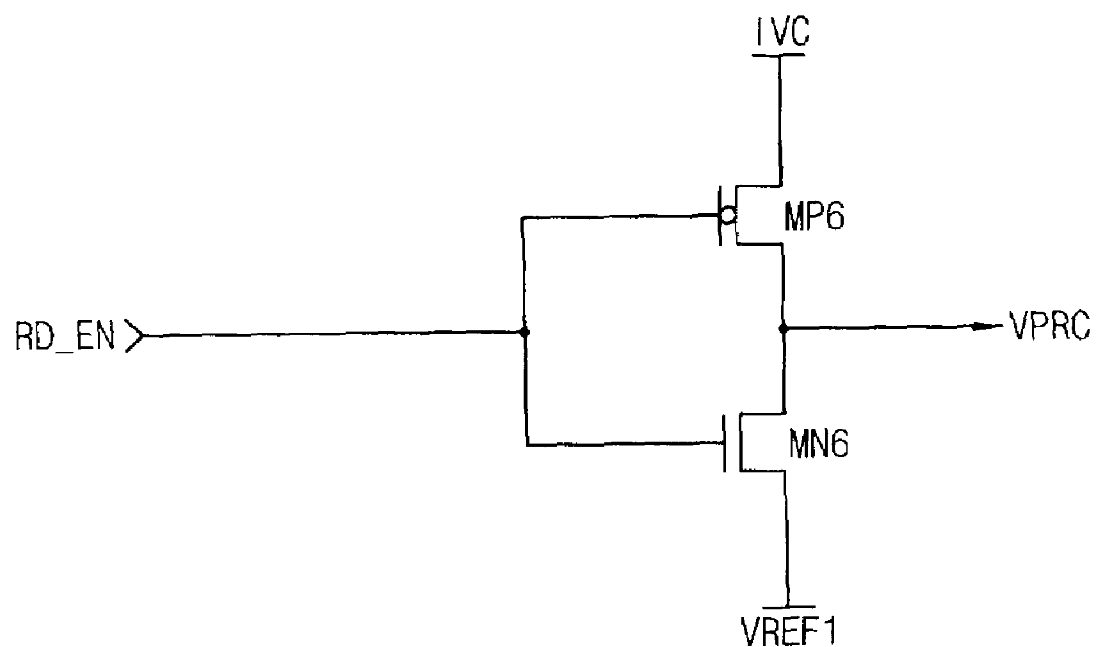
FIG. 12 is a circuit diagram illustrating an example of the precharge voltage generating circuit included in the I/O sense amplifier circuit of FIG. 11.

FIG. 12 is a circuit diagram illustrating an example of the precharge voltage generating circuit 1490 included in the I/O sense amplifier circuit 1400*b* of FIG. 11.

Referring to FIG. 12, the precharge voltage generating circuit 1490 may include a PMOS transistor MP6 and an NMOS transistor MN6.

The PMOS transistor MP6 and the NMOS transistor MN6 are serially coupled between an internal power supply voltage IVC and a first reference voltage VREF1 and output the precharge voltage VPRC in response to the read enable signal RD_EN.

Figure 13:
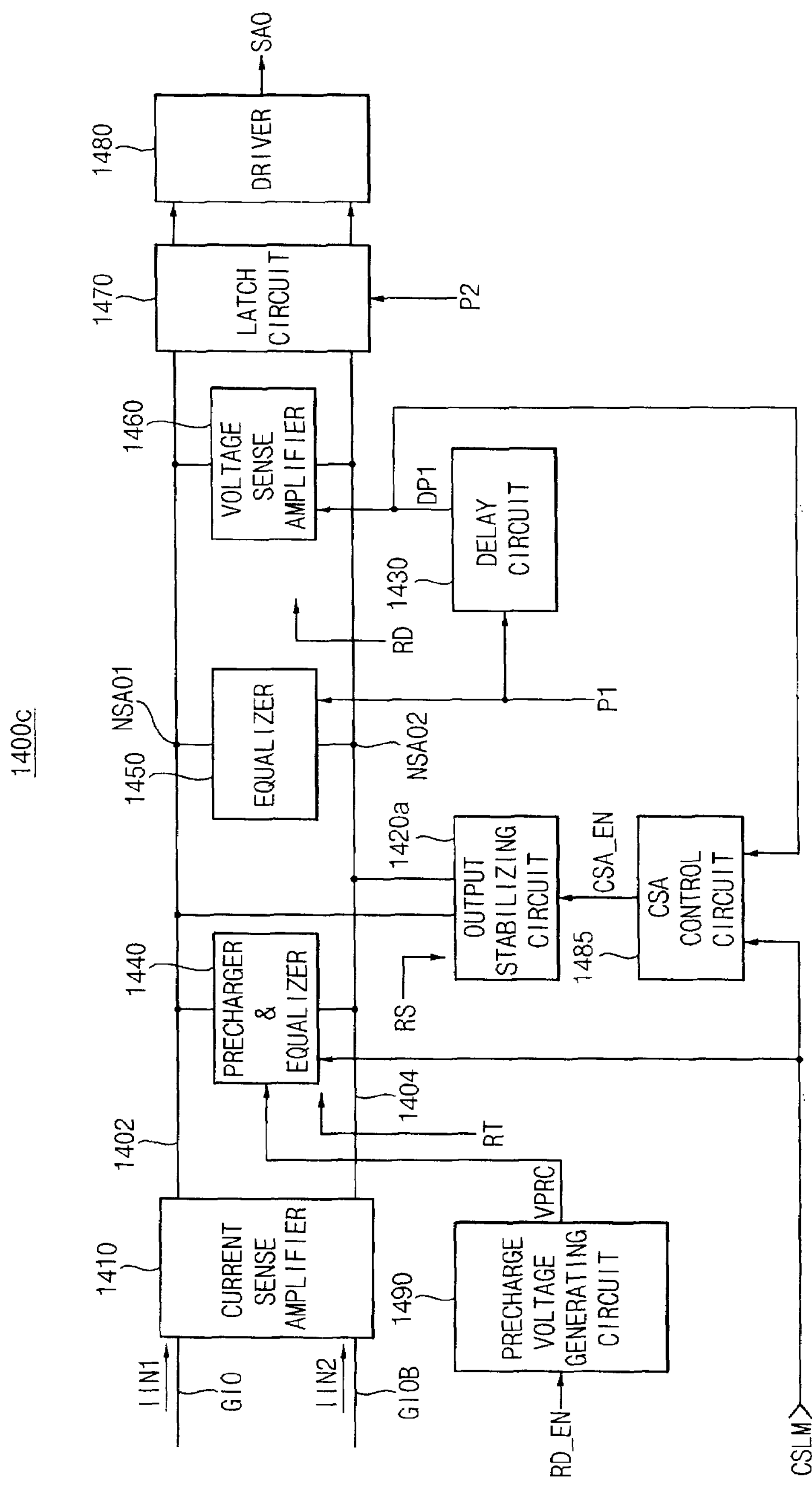
FIG. 13 is a circuit diagram illustrating an I/O sense amplifier circuit according to an exemplary embodiment of the present invention.

FIG. 13 is a circuit diagram illustrating an I/O sense amplifier circuit according to an exemplary embodiment of the present invention, which may be included in the semiconductor memory device 1000 of FIG. 1.

Referring to FIG. 13, an I/O sense amplifier circuit 1400*c* may include a current sense amplifier 1410, a voltage sense amplifier 1460, an output stabilizing circuit 1420*a*, a precharger/equalizer 1440, an equalizer 1450, a delay circuit 1430, a latch circuit 1470, a driver 1480, a precharge voltage generating circuit 1490, and a current sense amplifier control circuit 1485. The I/O sense amplifier circuit 1400*c* of FIG. 13 may further include the current sense amplifier control circuit 1485 compared with the I/O sense amplifier circuit 1400*b* of FIG. 12.

The current sense amplifier control circuit 1485 generates a current sense amplifier enable signal CSA_EN based on the first control signal CSLM and the third control signal DP1. The output stabilizing circuit 1420*a* is coupled between the amplifier output line pair 1402 and 1404 and an input resistance of the output stabilizing circuit 1420*a* corresponds to a positive value. The output stabilizing circuit 1420*a* stabilizes the output voltage of the voltage sense amplifier 1460 in response to the current sense amplifier enable signal CSA_EN. The output stabilizing circuit 1420*a* operates as a load of the current sense amplifier 1410.

Figure 14:
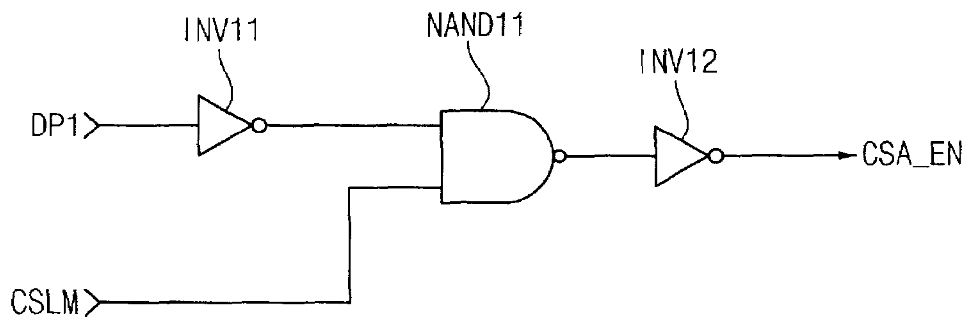
FIG. 14 is a circuit diagram illustrating an example of the current sense amplifier control circuit included in the I/O sense amplifier circuit of FIG. 13.

FIG. 14 is a circuit diagram illustrating an example of the current sense amplifier control circuit 1485 included in the I/O sense amplifier circuit 1400*c* of FIG. 13.

Referring to FIG. 14, the current sense amplifier control circuit 1485 may include a first inverter INV11, a NAND gate NAND11, and a second inverter INV12.

The first inverter INV11 converts the third control signal DP1. The NAND gate NAND11 performs a NAND operation on the first control signal CSLM and an output of the first inverter INV11. The second inverter INV12 converts an output signal of the NAND gate NAND11 and outputs the current sense amplifier enable signal CSA_EN.

FIG. 15 is a timing diagram illustrating an operation of the I/O sense amplifier circuit 1400*c* of FIG. 13.

The operation of the 110 sense amplifier circuit 1400*c* will be described with reference to FIGS. 13 to 15.

The precharger/equalizer 1440 precharges and equalizes the sense amplifier output line pair 1402 and 1404 located between the current sense amplifier 1410 and the latch circuit 1470 in response to the first control signal CSLM. The precharge voltage generating circuit 1490 generates the precharge voltage VPRC fed to precharger/equalizer 1440 in response to the read enable signal RD_EN.

As described above, the output stabilizing circuit 1420*a* stabilizes the output voltage of the current sense amplifier 1460 as well as operates as the load of the current sense amplifier 1410. Therefore, the current sense amplifier 1410 is enabled after the output stabilizing circuit 1420*a* is enabled in response to the current sense amplifier enable signal CSA_EN. The equalizer 1450 equalizes the sense amplifier output line pair 1402 and 1404 in response to the second control signal P1 that is activated later than a time when the first control signal CSLM is activated. For example, the sense amplifier output line pair 1402 and 1404 may be equalized when the second control signal P1 corresponds to the logic state “high”. The sense amplifier output line pair 1402 and 1404 may be unequalized when the second control signal P1 corresponds to the logic state “low”. The voltage sense amplifier 1460 is enabled in response to the third control signal DP1 corresponding to a delayed signal of the second control signal P1. The third control signal DP1 is delayed by the delay circuit 1430 to generate the second control signal P1.

The current sense amplifier control circuit 1485 generates the current sense amplifier enable signal CSA_EN based on the first control signal CSLM and the third control signal DP1.

Referring to FIG. 15, the precharge voltage VPRC has a voltage level of the internal power supply voltage IVC when the read enable signal RD_EN corresponds to a disable state. The precharge voltage VPRC has a voltage level that is one half of the internal power supply voltage, that is, IVC/2, when the read enable signal RD_EN corresponds to an activated state. The first control signal CSLM may be a column selection master signal.

The equalizer 1450 is turned off when the second control signal P1 corresponds to the logic state “low”.

Referring to FIG. 15, the falling edge of the inverted signal DP1B of the third control signal DP1 lags behind the falling edge of the second control signal P1. The rising edge of the inverted signal DP1B of the third control signal DP1 rarely lags behind the rising edge of the second control signal P1. That is, the delay circuit 1430 delays the falling edge of the second control signal P1, but does not delay the rising edge of the second control signal P1 for performing the following precharge operation. The equalizer 1450 equalizes the sense amplifier output line pair 1402 and 1404 when the second control signal P1 corresponds to the logic state “high”. The equalizer 1450 unequalizes the sense amplifier output line pair 1402 and 1404 when the second control signal P1 corresponds to the logic state "low".

Referring to FIG. 8, the voltage sense amplifier 1460 may be activated VSA ON when the third control signal DP1 corresponds to the logic state "high" and the inverted signal DP1B of the third control signal DP1 corresponds to the logic state "low". The current sense amplifier enable signal CSA_EN is enabled in response to the first control signal CSLM and disabled in response to the inverted signal DP1B of the third control signal DP1. Referring to FIG. 13, the output stabilizing circuit 1420*a* is deactivated when the current sense amplifier enable signal CSA_EN is disabled.

As described above, the current sense amplifier 1410 does not operate when the output stabilizing circuit 1420*a* is deactivated. When the current sense amplifier 1410 is deactivated after the voltage sense amplifier 1460 senses the output signal of the current sense amplifier 1410, a power consumption and clock cycle time may be reduced.

In FIG. 15, T1 corresponds to a time interval between a transition point when the precharge voltage VPRC transits from IVC to IVC/2 and a rising edge of the first control signal CSLM, and T2 corresponds to a time interval between a falling edge of the first control signal CSLM and a transition point when the precharge voltage VPRC transits from IVC/2 to IVC. As such, for the stable operation of the I/O sense amplifier circuit 1400*c*, the first control signal CSLM is enabled after the precharge voltage generating circuit 1490 is turned on and disabled before the precharge voltage generating circuit 1490 is turned off. The precharge voltage VPRC does not have to be one half IVC/2 of the internal power supply voltage but can be any other selected voltage.

When the sense amplifier output line pair 1402 and 1404 is precharged to one half IVC/2 of the internal power supply voltage, the sense amplifier output line pair may be quickly equalized. Therefore, the sensing operation may be performed after the sense amplifier output line pair 1402 and 1404 is fully equalized. More specifically, the sense amplifier output line pair 1402 and 1404 may be fully equalized from the precharge operation period T3 for a second sensing operation, when the sense amplifier output line pair 1402 and 1404 is precharged to one half IVC/2 of the internal power supply voltage. To prevent a floating effect of the sense amplifier output line pair 1402 and 1404 while the voltage sense amplifier 1460 is deactivated, that is, the dual sense amplifier finalizes the sensing operation, the sense amplifier output line pair 1402 and 1404 is precharged to a fixed voltage.

When the voltage sense amplifier 1460 is turned on in response to the inverted signal DP1B of the third control signal DP1 and the current sense amplifier 1410 is deactivated by disabling the current sense amplifier enable signal CSA_EN, the unnecessary current dissipation may be reduced.

Figure 16:
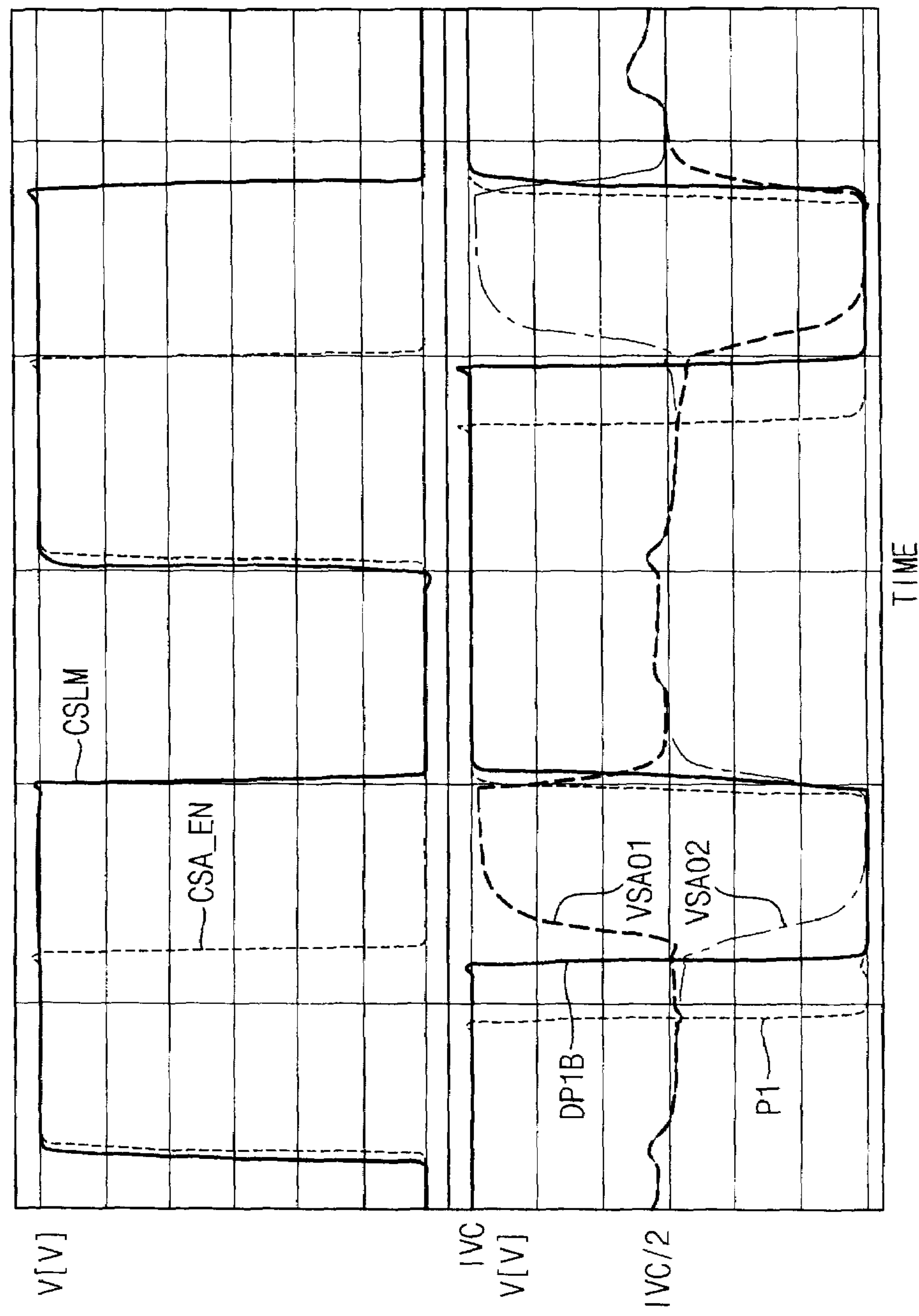
FIG. 16 is a diagram illustrating an example of the operation of the I/O sense amplifier circuit of FIG. 13.

FIG. 16 is a diagram illustrating an example of the operation of the I/O sense amplifier circuit of FIG. 13.

Referring to FIG. 16, the sense amplifier output line pair 1402 and 1404 in FIG. 13 is equalized to the one half IVC/2 of the internal power supply voltage when the second control signal P1 corresponds to the logic state "high". The current sense amplifier 1410 and the voltage sense amplifier 1460 start amplification operations when the second control signal P1 corresponds to the logic state "low". When the inverted signal DP1B of the third control signal CP1 corresponds to the logic state "low", the voltage sense amplifier 1460 in FIG. 13 is activated. When the inverted signal DP1B of the third control signal CP1 corresponds to the logic state "low", the current sense amplifier enable signal CSA_EN is disabled and the output stabilizing circuit 1420*a* in FIG. 13 is deactivated. As described above, the current sense amplifier 1410 in FIG. 13 operates after the output stabilizing circuit 1420*a* in FIG. 13 is activated. Accordingly, the current sense amplifier 1410 shown in FIG. 13 does not operate when the current sense amplifier enable signal CSA_EN is disabled.

In a sequential sensing operation, the I/O sense amplifier circuit performs a first amplification operation of the input current at a first pulse of the first control signal CSLM and performs a second amplification operation of the input current at a second pulse of the first control signal CSLM.

The sense amplifier output line pair 1402 and 1404 may be stably precharged and equalized before the second amplification operation, as illustrated in FIG. 16.

The sense amplifier circuit including both the current amplifier and the voltage sense amplifier according to exemplary embodiments of the present invention may have high amplification gain and can stably perform the amplification operation of the dual sense amplifier. The sense amplifier circuit according to exemplary embodiments of the present invention may be adopted in the sense amplifier circuit, particularly the I/O sense amplifier circuit, included in a semiconductor memory device such as a dynamic random access memory (DRAM).

While exemplary embodiments of the present invention and their advantages have been described in detail, it should be understood that various changes, substitutions and alterations may be made herein without departing from the scope of the invention.

What is claimed is:

1. A sense amplifier circuit, comprising:

a current sense amplifier configured to amplify differential input currents to generate differential output voltages and configured to provide the differential output voltages to a sense amplifier output line pair;

a voltage sense amplifier coupled to the sense amplifier output line pair, the voltage sense amplifier configured to amplify the differential output voltages on the sense amplifier output line pair and configured to be activated at a time later than a time of activation of the current sense amplifier;

an output stabilizing circuit coupled to the sense amplifier output line pair, the output stabilizing circuit configured to stabilize the differential output voltages on the sense amplifier output line pair, the output stabilizing circuit having a positive input resistance;

a precharger/equalizer circuit configured to precharge the sense amplifier output line pair to a first precharge voltage and configured to equalize the sense amplifier output linepair, in response to a first control signal; and an equalizer configured to equalize the sense amplifier output line pair in response to a second control signal that is activated at a time later than a time of activation of the first control signal.

2. The sense amplifier circuit of claim 1, wherein the output stabilizing circuit operates as a load of the current sense amplifier.

3. The sense amplifier circuit of claim 1, wherein a resistance of input resistances of the voltage sense amplifier and the output stabilizing circuit combined in parallel has a positive value.

4. The sense amplifier circuit of claim 3, wherein an absolute value of the input resistance of the output stabilizing circuit is smaller than an absolute value of the input resistance of the voltage sense amplifier.

5. The sense amplifier circuit of claim 4, wherein the output stabilizing circuit comprises a diode-connected transistor.

6. The sense amplifier circuit of claim 1, further comprising:

a delay circuit configured to delay the second control signal to generate a third control signal, wherein the voltage sense amplifier is activated in response to the third control signal.

7. The sense amplifier circuit of claim 1, wherein the first precharge voltage is an internal power supply voltage that is generated in a semiconductor device.

8. The sense amplifier circuit of claim 1, wherein the output stabilizing circuit is activated in response to the first control signal.

9. The sense amplifier circuit of claim 1, further comprising:

a precharge voltage generating circuit configured to select one of an internal power supply voltage and a first reference voltage in response to a read enable signal to generate the selected voltage as the first precharge voltage.

10. The sense amplifier circuit of claim 9, wherein the first reference voltage has a voltage level of one half of the internal power supply voltage.

11. The sense amplifier circuit of claim 9, wherein the precharge voltage generating circuit comprises:

a p-type metal oxide semiconductor (PMOS) transistor configured to output the internal power supply voltage as the first precharge voltage in response to the read enable signal; and an n-type metal oxide semiconductor (NMOS) transistor configured to output the first reference voltage as the first precharge voltage in response to the read enable signal.

12. The sense amplifier circuit of claim 1, wherein the output stabilizing circuit is activated in response a current sense amplifier enable signal.

13. The sense amplifier circuit of claim 12, wherein the sense amplifier circuit further comprises:

a current sense amplifier control circuit configured to generate the current sense amplifier enable signal based on the first control signal and the third control signal.

14. A sense amplifier circuit, comprising:

a current sense amplifier configured to amplify differential input currents to generate differential output voltages and configured to provide the differential output voltages to a sense amplifier output line pair;

a voltage sense amplifier coupled to the sense amplifier output line pair, the voltage sense amplifier configured to amplify the differential output voltages on the sense amplifier output line pair and configured to be activated at a time later than a time of activation of the current sense amplifier; and an output stabilizing circuit coupled to the sense amplifier output line pair, the output stabilizing circuit configured to stabilize the differential output voltages on the sense amplifier output line pair, the output stabilizing circuit having a positive input resistance;

wherein the current sense amplifier is deactivated after the voltage sense amplifier is activated.

15. A semiconductor memory device, comprising:

a memory core coupled to a bit-line pair;

a column selection circuit configured to output voltage signals of the bit-line pair to a local input-output (I/O) line pair in response to a column selection signal;

a local sense amplifier circuit configured to amplify signals of the local I/O line pair to output the amplified signals to a global I/O line pair; and an I/O sense amplifier circuit configured to amplify signals of the global I/O line pair to generate output data, the I/O sense amplifier circuit comprising:

a current sense amplifier configured to amplify differential input currents to generate differential output voltages and configured to provide the differential output voltages to a sense amplifier output line pair;

a voltage sense amplifier coupled to the sense amplifier output line pair, the voltage sense amplifier configured to amplify the differential output voltages on the sense amplifier output line pair and configured to be activated at a time later than a time of activation of the current sense amplifier; and an output stabilizing circuit coupled to the sense amplifier output line pair, the output stabilizing circuit configured to stabilize the differential output voltages on the sense amplifier output line pair, the output stabilizing circuit having a positive input resistance;

a precharger/equalizer circuit configured to precharge the sense amplifier output line pair to a first precharge voltage and configured to equalize the sense amplifier output line pair in response to a first control signal; and an equalizer configured to equalize the sense amplifier output line pair in response to a second control signal that is activated at a time later than a time of activation of the first control signal.

16. The semiconductor memory device of claim 15, wherein the output stabilizing circuit operates as a load of the current sense amplifier.

17. The semiconductor memory device of claim 15, wherein a resistance of input resistances of the voltage sense amplifier and the output stabilizing circuit combined in parallel has a positive value.

18. The semiconductor memory device of claim 17, wherein an absolute value of the input resistance of the output stabilizing circuit is smaller than an absolute value of the input resistance of the voltage sense amplifier.

19. The semiconductor memory device of claim 15, wherein the current sense amplifier is deactivated after the voltage sense amplifier is activated.

* * * * *